US009899208B2

(12) United States Patent
Nondhasitthichai et al.

(10) Patent No.: US 9,899,208 B2
(45) Date of Patent: Feb. 20, 2018

(54) MOLDED LEADFRAME SUBSTRATE SEMICONDUCTOR PACKAGE

(75) Inventors: Somchai Nondhasitthichai, Bangkok (TH); Saravuth Sirinorakul, Bangkok (TH)

(73) Assignee: UTAC THAI LIMITED, Bangkok (TH)

( * ) Notice: Subject to any disclaimer, the term of this patent is extended or adjusted under 35 U.S.C. 154(b) by 194 days.

(21) Appl. No.: 12/964,698

(22) Filed: Dec. 9, 2010

(65) Prior Publication Data

US 2011/0076805 A1 Mar. 31, 2011

Related U.S. Application Data

(62) Division of application No. 12/002,187, filed on Dec. 14, 2007, now abandoned.
(Continued)

(51) Int. Cl.
*H01L 21/00* (2006.01)
*H01L 21/56* (2006.01)
(Continued)

(52) U.S. Cl.
CPC ............ *H01L 21/00* (2013.01); *H01L 21/561* (2013.01); *H01L 21/68* (2013.01); *H01L 23/3114* (2013.01); *H01L 23/49861* (2013.01); *H01L 24/00* (2013.01); *H01L 24/97* (2013.01); *H01L 23/00* (2013.01); *H01L 24/48* (2013.01); *H01L 2224/32225* (2013.01); *H01L 2224/32245* (2013.01); *H01L 2224/32257* (2013.01); *H01L 2224/48247* (2013.01); *H01L 2224/73265* (2013.01); *H01L 2224/97* (2013.01); *H01L 2924/00014* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01);
(Continued)

(58) Field of Classification Search
USPC ......................................................... 257/666
See application file for complete search history.

(56) References Cited

U.S. PATENT DOCUMENTS 3,611,061 A   10/1971   Segerson ................. 317/234 R
4,411,719 A   10/1983   Lindberg ....................... 156/64
(Continued)

OTHER PUBLICATIONS

Quirk, Michael, and Julian Serda. Semiconductor Manufacturing Technology. Upper Saddle River, NJ: Prentice Hall, 2001.*
(Continued)

*Primary Examiner* — Mark Tornow
(74) *Attorney, Agent, or Firm* — Haverstock & Owens LLP (57) ABSTRACT

A process for forming land grid array semiconductor packages includes a leadframe that is supported by a substrate comprising mold compound. In some embodiments, at least one die is electrically coupled to the leadframe by bondwires. The package comprises a second mold compound to act as an encapsulant. An apparatus for forming a land grid array semiconductor package includes means for molding a leadframe, assembling thereon at least one semiconductor device, applying a second mold, and singulating to form individual devices. A land grid array package comprises a leadframe, a substrate for supporting the leadframe, at least one semiconductor device and a mold compound.

5 Claims, 13 Drawing Sheets

Related U.S. Application Data (60) Provisional application No. 60/875,162, filed on Dec. 14, 2006, provisional application No. 60/877,274, filed on Dec. 26, 2006.

(51) Int. Cl.
*H01L 23/31* (2006.01)
*H01L 23/498* (2006.01)
*H01L 21/68* (2006.01)
*H01L 23/00* (2006.01)

(52) U.S. Cl.
CPC .............. *H01L 2924/01047* (2013.01); *H01L 2924/01079* (2013.01); *H01L 2924/01082* (2013.01); *H01L 2924/09701* (2013.01); *H01L 2924/12041* (2013.01); *H01L 2924/14* (2013.01); *H01L 2924/1511* (2013.01); *H01L 2924/15183* (2013.01); *H01L 2924/15311* (2013.01); *H01L 2924/1711* (2013.01); *H01L 2924/181* (2013.01)

(56) References Cited

U.S. PATENT DOCUMENTS

| | | | |
|---|---|---|---|
| 4,501,960 A | 2/1985 | Jouvet et al. | 235/492 |
| 4,801,561 A | 1/1989 | Sankhagowit | 437/207 |
| 4,855,672 A | 8/1989 | Shreeve | 324/158 R |
| 5,105,259 A | 4/1992 | McShane et al. | |
| 5,195,023 A | 3/1993 | Manzione et al. | |
| 5,247,248 A | 9/1993 | Fukunaga | 324/158 |
| 5,248,075 A | 9/1993 | Young et al. | 228/5.1 |
| 5,281,851 A | 1/1994 | Mills et al. | |
| 5,285,104 A | 2/1994 | Kondo et al. | |
| 5,292,688 A | 3/1994 | Hsiao | |
| 5,343,076 A | 8/1994 | Katayama et al. | |
| 5,396,185 A | 3/1995 | Honma et al. | 324/754 |
| 5,397,921 A | 3/1995 | Karnezos | 257/779 |
| 5,479,105 A | 12/1995 | Kim et al. | 324/755 |
| 5,535,101 A | 7/1996 | Miles et al. | |
| 5,596,231 A | 1/1997 | Combs | 257/776 |
| 5,767,527 A | 6/1998 | Yoneda et al. | |
| 5,843,808 A | 12/1998 | Karnezos | 438/121 |
| 5,959,363 A | 9/1999 | Yamada et al. | |
| 5,990,692 A | 11/1999 | Jeong et al. | 324/755 |
| 6,033,933 A | 3/2000 | Hur | |
| 6,072,239 A | 6/2000 | Yoneda et al. | 257/730 |
| 6,111,324 A | 8/2000 | Sheppard et al. | 257/787 |
| 6,159,770 A | 12/2000 | Tetaka et al. | 438/112 |
| 6,177,729 B1 | 1/2001 | Benenati et al. | |
| 6,197,615 B1 | 3/2001 | Song et al. | |
| 6,208,020 B1 | 3/2001 | Minamio et al. | |
| 6,229,200 B1 | 5/2001 | Mclellan et al. | 257/666 |
| 6,242,281 B1 | 6/2001 | Mclellan et al. | 438/106 |
| 6,250,841 B1 | 6/2001 | Ledingham | |
| 6,284,569 B1 | 9/2001 | Sheppard et al. | 438/110 |
| 6,285,075 B1 | 9/2001 | Combs et al. | 257/675 |
| 6,294,100 B1 | 9/2001 | Fan et al. | 216/14 |
| 6,304,000 B1 | 10/2001 | Isshiki et al. | 257/782 |
| 6,326,678 B1 | 12/2001 | Karnezos et al. | 257/666 |
| 6,329,711 B1 | 12/2001 | Kawahara et al. | 257/698 |
| 6,353,263 B1 | 3/2002 | Dotta et al. | 257/777 |
| 6,372,625 B1 | 4/2002 | Shigeno et al. | |
| 6,376,921 B1 | 4/2002 | Yoneda et al. | 257/787 |
| 6,384,472 B1 | 5/2002 | Huang | |
| 6,392,427 B1 | 5/2002 | Yang | 324/755 |
| 6,414,385 B1 | 7/2002 | Huang et al. | 257/690 |
| 6,429,048 B1 | 8/2002 | McLellan et al. | 438/108 |
| 6,448,665 B1 | 9/2002 | Nakazawa | |
| 6,451,709 B1 | 9/2002 | Hembree | 438/759 |
| 6,455,348 B1 | 9/2002 | Yamaguchi | 438/106 |
| 6,476,469 B2 | 11/2002 | Hung et al. | |
| 6,489,218 B1 | 12/2002 | Kim et al. | 438/460 |
| 6,498,099 B1 | 12/2002 | McLellan et al. | 438/689 |
| 6,507,116 B1 | 1/2003 | Caletka et al. | 257/778 |
| 6,545,332 B2 * | 4/2003 | Huang | 257/433 |
| 6,545,347 B2 | 4/2003 | McClellan | 257/690 |
| 6,552,417 B2 | 4/2003 | Combs | 257/666 |
| 6,552,423 B2 | 4/2003 | Song et al. | 257/679 |
| 6,566,740 B2 | 5/2003 | Yasunaga et al. | 257/670 |
| 6,573,121 B2 | 6/2003 | Yoneda et al. | 438/106 |
| 6,585,905 B1 | 7/2003 | Fan et al. | 216/14 |
| 6,586,834 B1 | 7/2003 | Sze et al. | 257/712 |
| 6,635,957 B2 | 10/2003 | Kwan et al. | 257/691 |
| 6,661,104 B2 | 12/2003 | Jiang | |
| 6,667,191 B1 | 12/2003 | McLellan et al. | 438/121 |
| 6,683,368 B1 | 1/2004 | Mostafazadeh | |
| 6,686,667 B2 | 2/2004 | Chen et al. | |
| 6,703,696 B2 | 3/2004 | Ikenaga et al. | 257/678 |
| 6,723,585 B1 | 4/2004 | Tu et al. | |
| 6,724,071 B2 | 4/2004 | Combs | 257/666 |
| 6,734,044 B1 | 5/2004 | Fan et al. | 438/123 |
| 6,734,552 B2 | 5/2004 | Combs et al. | 257/707 |
| 6,737,755 B1 | 5/2004 | McLellan et al. | 257/796 |
| 6,764,880 B2 | 7/2004 | Wu et al. | 438/123 |
| 6,781,242 B1 | 8/2004 | Fan et al. | 257/777 |
| 6,800,948 B1 | 10/2004 | Fan et al. | 257/783 |
| 6,812,552 B2 | 11/2004 | Islam et al. | 257/666 |
| 6,818,472 B1 | 11/2004 | Fan et al. | 438/106 |
| 6,818,978 B1 | 11/2004 | Fan | 257/686 |
| 6,818,980 B1 | 11/2004 | Pedron, Jr. | 257/706 |
| 6,841,859 B1 | 1/2005 | Thamby et al. | 257/676 |
| 6,876,066 B2 | 4/2005 | Fee et al. | 257/666 |
| 6,893,169 B1 | 5/2005 | Exposito et al. | |
| 6,894,376 B1 | 5/2005 | Mostafazadeh et al. | |
| 6,897,428 B2 | 5/2005 | Minamio et al. | 250/208.1 |
| 6,927,483 B1 | 8/2005 | Lee et al. | |
| 6,933,176 B1 | 8/2005 | Kirloskar et al. | 438/122 |
| 6,933,594 B2 | 8/2005 | McLellan et al. | 257/676 |
| 6,940,154 B2 | 9/2005 | Pedron et al. | 257/666 |
| 6,946,324 B1 | 9/2005 | McLellan et al. | 438/111 |
| 6,964,918 B1 | 11/2005 | Fan et al. | 438/614 |
| 6,967,126 B2 | 11/2005 | Lee et al. | 438/122 |
| 6,979,594 B1 | 12/2005 | Fan et al. | 438/113 |
| 6,982,491 B1 | 1/2006 | Fan et al. | 257/778 |
| 6,984,785 B1 | 1/2006 | Diao et al. | 174/52.2 |
| 6,989,294 B1 | 1/2006 | McLellan et al. | 438/111 |
| 6,995,460 B1 | 2/2006 | McLellan et al. | 257/676 |
| 7,008,825 B1 | 3/2006 | Bancod et al. | 438/123 |
| 7,009,286 B1 | 3/2006 | Kirloskar et al. | 257/684 |
| 7,045,883 B1 | 5/2006 | McCann et al. | |
| 7,049,177 B1 | 5/2006 | Fan et al. | 438/123 |
| 7,052,935 B2 | 5/2006 | Pai et al. | |
| 7,060,535 B1 | 6/2006 | Sirinorakul et al. | 438/123 |
| 7,071,545 B1 | 7/2006 | Patel et al. | 257/686 |
| 7,091,581 B1 | 8/2006 | McLellan et al. | 257/673 |
| 7,101,210 B2 | 9/2006 | Lin et al. | 439/331 |
| 7,102,210 B2 | 9/2006 | Ichikawa | 257/666 |
| 7,125,747 B2 | 10/2006 | Lee et al. | |
| 7,126,218 B1 | 10/2006 | Darveaux et al. | |
| 7,205,178 B2 | 4/2007 | Shiu et al. | 438/110 |
| 7,224,048 B1 | 5/2007 | McLellan et al. | 257/678 |
| 7,247,526 B1 | 7/2007 | Fan et al. | 438/123 |
| 7,253,503 B1 | 8/2007 | Fusaro et al. | |
| 7,259,678 B2 | 8/2007 | Brown et al. | |
| 7,274,088 B2 | 9/2007 | Wu et al. | 257/673 |
| 7,314,820 B2 | 1/2008 | Lin et al. | 438/617 |
| 7,315,077 B2 | 1/2008 | Choi et al. | |
| 7,315,080 B1 | 1/2008 | Fan et al. | 257/717 |
| 7,339,658 B2 | 3/2008 | Beyerlein et al. | |
| 7,342,305 B1 | 3/2008 | Diao et al. | 257/706 |
| 7,344,920 B1 | 3/2008 | Kirloskar et al. | 438/123 |
| 7,348,663 B1 * | 3/2008 | Kirloskar et al. | 257/704 |
| 7,358,119 B2 | 4/2008 | McLellan et al. | 438/127 |
| 7,371,610 B1 | 5/2008 | Fan et al. | 438/112 |
| 7,372,151 B1 | 5/2008 | Fan et al. | 257/738 |
| 7,381,588 B1 | 6/2008 | Patel et al. | 438/109 |
| 7,399,658 B2 | 7/2008 | Shim et al. | 438/106 |
| 7,408,251 B2 | 8/2008 | Hata et al. | 257/678 |
| 7,411,289 B1 | 8/2008 | McLellan et al. | 257/700 |
| 7,449,771 B1 | 11/2008 | Fan et al. | 257/676 |
| 7,459,345 B2 | 12/2008 | Hwan | |
| 7,482,690 B1 | 1/2009 | Fan et al. | 257/724 |
| 7,495,319 B2 | 2/2009 | Fukuda et al. | |

(56) References Cited

U.S. PATENT DOCUMENTS

| | | | |
|---|---|---|---|
| 7,507,603 B1 | 3/2009 | Berry et al. | |
| 7,595,225 B1 | 9/2009 | Fan et al. | 438/112 |
| 7,608,484 B2 | 10/2009 | Lange et al. | |
| 7,709,857 B2 | 5/2010 | Kim et al. | |
| 7,714,418 B2 | 5/2010 | Lim et al. | 257/670 |
| 8,035,207 B2 | 10/2011 | Camacho et al. | |
| 8,710,651 B2 | 4/2014 | Sakata | |
| 2001/0005047 A1 | 6/2001 | Jimarez et al. | |
| 2001/0007285 A1 | 7/2001 | Yamada et al. | |
| 2002/0090162 A1 | 7/2002 | Asada | |
| 2002/0109214 A1 | 8/2002 | Minamio et al. | |
| 2003/0006055 A1 | 1/2003 | Chien-Hung et al. | |
| 2003/0045032 A1 | 3/2003 | Abe | 438/123 |
| 2003/0071333 A1 | 4/2003 | Matsuzawa | 257/676 |
| 2003/0102540 A1 | 6/2003 | Lee | |
| 2003/0143776 A1 | 7/2003 | Pedrron, Jr. et al. | 438/106 |
| 2003/0178719 A1 | 9/2003 | Combs et al. | 257/704 |
| 2003/0201520 A1* | 10/2003 | Knapp et al. | 257/666 |
| 2003/0207498 A1 | 11/2003 | Islam et al. | 438/120 |
| 2003/0234454 A1 | 12/2003 | Pedron et al. | |
| 2004/0014257 A1 | 1/2004 | Kim et al. | 438/111 |
| 2004/0226773 A1 | 2/2004 | Koon et al. | |
| 2004/0046237 A1 | 3/2004 | Abe et al. | 257/676 |
| 2004/0046241 A1 | 3/2004 | Combs et al. | 257/678 |
| 2004/0070055 A1 | 4/2004 | Punzalan et al. | |
| 2004/0080025 A1 | 4/2004 | Kasahara et al. | 257/666 |
| 2004/0110319 A1 | 6/2004 | Fukutomi et al. | 438/106 |
| 2005/0003586 A1 | 1/2005 | Shimanuki et al. | 438/124 |
| 2005/0077613 A1 | 4/2005 | McLellan et al. | 257/706 |
| 2005/0184404 A1 | 8/2005 | Huang et al. | |
| 2005/0236701 A1 | 10/2005 | Minamio et al. | |
| 2005/0263864 A1 | 12/2005 | Islam et al. | |
| 2006/0071351 A1 | 4/2006 | Lange | |
| 2006/0170081 A1 | 8/2006 | Gerber et al. | |
| 2006/0192295 A1 | 8/2006 | Lee et al. | 257/778 |
| 2006/0223229 A1 | 10/2006 | Kirloskar et al. | 438/106 |
| 2006/0223237 A1 | 10/2006 | Combs et al. | 438/122 |
| 2006/0237231 A1 | 10/2006 | Hata et al. | |
| 2006/0273433 A1 | 12/2006 | Itou et al. | 257/666 |
| 2007/0001278 A1* | 1/2007 | Jeon et al. | 257/676 |
| 2007/0013038 A1 | 1/2007 | Yang | |
| 2007/0029540 A1 | 2/2007 | Kajiwara et al. | |
| 2007/0093000 A1 | 4/2007 | Shim et al. | |
| 2007/0200210 A1 | 8/2007 | Zhao et al. | |
| 2007/0235217 A1 | 10/2007 | Workman | 174/260 |
| 2008/0048308 A1 | 2/2008 | Lam | |
| 2008/0150094 A1 | 6/2008 | Anderson | 257/659 |
| 2008/0251913 A1 | 10/2008 | Inomata | |
| 2009/0014848 A1 | 1/2009 | Ong Wai Lian et al. | |
| 2009/0152691 A1 | 6/2009 | Nguyen et al. | |
| 2009/0152694 A1 | 6/2009 | Bemmerl et al. | |
| 2009/0230525 A1 | 9/2009 | Chang Chien et al. | |
| 2009/0236713 A1 | 9/2009 | Xu et al. | |
| 2010/0133565 A1 | 6/2010 | Cho et al. | |
| 2010/0149773 A1 | 6/2010 | Said | |
| 2010/0178734 A1 | 7/2010 | Lin | |
| 2010/0224971 A1 | 9/2010 | Li | |
| 2011/0115061 A1 | 5/2011 | Krishnan et al. | |
| 2011/0201159 A1 | 8/2011 | Mori et al. | |
| 2013/0069221 A1 | 3/2013 | Lee et al. | |

OTHER PUBLICATIONS

Office Action dated Dec. 19, 2012, U.S. Appl. No. 12/834,688, filed Jul. 12, 2010, Saravuth Sirinorakul.

Office Action dated Dec. 5, 2011, U.S. Appl. No. 12/576,846, filed Oct. 9, 2009, Somchai Nondhasitthichai et al.

Office Action dated Nov. 30, 2009, U.S. Appl. No. 12/002,186, filed Dec. 14, 2007, Somchai Nondhasitthichai et al.

Office Action dated Jan. 28, 2010, U.S. Appl. No. 12/378,119, filed Feb. 10, 2009, Somchai Nondhasitthichai et al.

Office Action dated May 11, 2010, U.S. Appl. No. 12/002,054, filed Dec. 14, 2007, Somchai Nondhasitthichai et al.

Office Action dated Sep. 23, 2010, U.S. Appl. No. 12/002,186, filed Dec. 14, 2007, Somchai Nondhasitthichai et al.

Office Action dated Oct. 29, 2010, U.S. Appl. No. 12/378,119, filed Feb. 2, 2009, Somchai Nondhasitthichai et al.

Office Action dated Dec. 6, 2010, U.S. Appl. No. 12/231,710, filed Sep. 4, 2008, Saravuth Sirinorakul et al.

Non-Final Office Action dated Dec. 20, 2012, U.S. Appl. No. 13/045,253, filed Mar. 10, 2011, Saravuth Sirinorakul.

Office Action dated Apr. 25, 2012, U.S. Appl. No. 12/960,268, filed Dec. 3, 2010, Somchai Nondhasitthichai et al.

Office Action dated May 7, 2012, U.S. Appl. No. 12/576,846, filed Oct. 9, 2009, Somchai Nondhasitthichai et al.

Office Action dated Aug. 3, 2011, U.S. Appl. No. 12/002,187, filed Dec. 14, 2007, Somchai Nondhasitthichai et al.

Notice of Allowance, dated Nov. 28, 2012, U.S. Appl. No. 12/960,268, filed Dec. 3, 2012, Saravuth Sirinorakul et al.

Office Action dated Feb. 10, 2011, U.S. Appl. No. 12/002,187, filed Dec. 14, 2007, Somchai Nondhasitthichai et al.

Michael Quirk and Julian Serda, Semiconductor Manufacturing Technology, Pearson Education International, Pearson Prentice Hall , 2001, p. 587-588.

Office Action dated May 9, 2011, U.S. Appl. No. 12/231,710, filed Sep. 4, 2008, Saravuth Sirinorakul et al.

Office Action dated Dec. 27, 2013, U.S. Appl. No. 12/002,186, filed Dec. 14, 2007, Somchai Nondhasitthichai et al.

Office Action dated Jan. 28, 2014, U.S. Appl. No. 12/002,054, filed Dec. 14, 2007, Somchai Nondhasitthichai et al.

Office Action dated Jan. 15, 2014, U.S. Appl. No. 12/002,187, filed Dec. 14, 2007, Somchai Nondhasitthichai et al.

Office Action dated Dec. 31, 2013, U.S. Appl. No. 12/378,119, filed Feb. 10, 2009, Somchai Nondhasitthichai et al.

Office Action dated Dec. 27, 2013, U.S. Appl. No. 12/576,846, filed Oct. 9, 2009, Somchai Nondhasitthichai et al.

Office Action dated Jul. 16, 2014, U.S. Appl. No. 12/378,119, filed Feb. 10, 2009, Somchai Nondhasitthichai et al.

Non-Final Office Action dated Dec. 30, 2014, U.S. Appl. No. 13/886,888, filed May 3, 2013, Somchai Nondhasitthichai.

Office Action dated Dec. 9, 2015, U.S. Appl. No. 12/002,054, filed Dec. 14, 2007, Somchai Nondhasitthichai et al., 25 pages.

Office Action dated Nov. 2, 2015, U.S. Appl. No. 12/834,688, filed Jul. 12, 2010, Saravuth Sirinorakul, 17 pages.

Office Action dated Aug. 24, 2016, U.S. Appl. No. 12/914,694, filed Oct. 28, 2010, Saravuth Sirinorakul, 22 pages.

* cited by examiner

MOLDED LEADFRAME SUBSTRATE SEMICONDUCTOR PACKAGE

RELATED APPLICATIONS

This application is a Divisional Application of U.S. patent application Ser. No. 12/002,187, filed Dec. 14, 2007, which in turn claims benefit of priority under 35 U.S.C. section 119(e) of co-pending U.S. Provisional Patent Application 60/875,162 filed Dec. 14, 2006, entitled MOLDED-LEAD-FRAME SUBSTRATE SEMICONDUCTOR PACKAGE and U.S. Provisional Patent Application 60/877,274 filed Dec. 26, 2006, entitled MOLDED-LEADFRAME SUBSTRATE SEMICONDUCTOR PACKAGE, all of which are incorporated herein by reference.

FIELD OF THE INVENTION

The present invention is in the field of semiconductor packaging and is more specifically directed to package with heat transfer.

BACKGROUND

The increasing demand for performance from electrical appliances has led to higher chip internal clock frequencies and parallelism, and has increased the need for higher bandwidth and lower latencies. For example, computer processor frequencies are predicted to reach 29 GHz by 2018, and off-chip signaling interface speeds are expected to exceed 56 Gb/s. Optimization of bandwidth, power, pin count, or number of wires and cost are the goals for high-speed interconnect design. The electrical performance of interconnects is restricted by noise and timing limitations of the silicon, package, board and cable. To that end, semiconductor packages must be made smaller, conforming more and more closely to the size of the die encapsulated within. However, as the size of the package shrinks to the size of the die itself, the size of the package becomes insufficient to support the number of leads generally required by current applications. Furthermore, these high speed devices generate significant heat which must be harvested or damage can occur.

Figure 1:
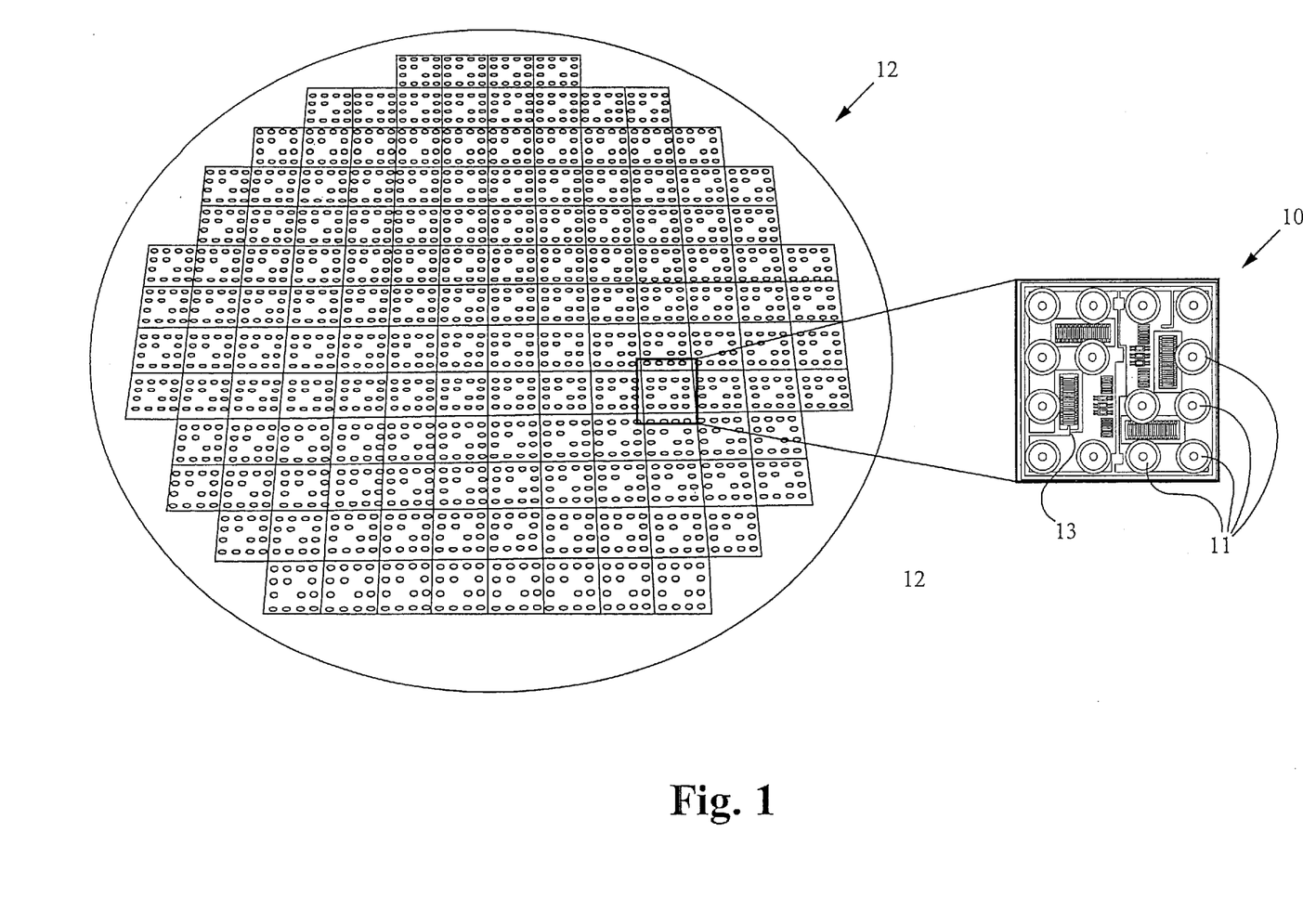
FIG. 1 is a prior art Chip Scale Package.

Chip Scale Packages (CSP) have emerged as the dominant package for such applications. FIG. 1 shows an example of a CSP in current practice. More specifically, the package in FIG. 1 is a Wafer Level Chip Scale Package 10 (WLCSP), commonly marketed by companies such as National Semiconductor Corporation as the Micro SMD and Maxim Integrated Products as the UCSP. Generally, solder bumps 11 are formed on processed and completed semiconductor wafers 12 before the wafers are sawn to form individual semiconductor device 13. Although this has dramatically reduced package size and can be useful in some instances, it suffers from drawbacks which remove it from consideration for certain applications. First, the pitch between the solder bumps must be made wide enough to effectuate assembly of the device onto a printed circuit board in application. This requirement can cause manufacturers to have to artificially grow die sizes to meet the minimum pitch, thereby increasing cost. Second, the total I/O count of the device is generally constrained due to the decreased reliability at the high bump counts. At bump counts higher than 49, or a 7×7 array, reliability becomes critical and applications such as hand held devices, which require a high degree of reliability, no longer become a possible marketplace. Furthermore, semiconductor devices generating significant heat require cooling, and difficulties arise when attempting to cool a CSP since there is very little surface area to mount a heat sink or other cooling device onto.

To overcome the issues mentioned above, the semiconductor industry has moved toward Ball Grid Array (BGA) packages. The BGA is descended from the pin grid array (PGA), which is a package with one face covered (or partly covered) with pins in a grid pattern. These pins are used to conduct electrical signals from the integrated circuit (IC) to the printed circuit board (PCB) it is placed on. In a BGA, the pins are replaced by balls of solder stuck to the bottom of the package. The device is placed on a PCB having copper pads in a pattern that matches the solder balls. The assembly is then heated, either in a reflow oven or by an infrared heater, causing the solder balls to melt. Surface tension causes the molten solder to hold the package in alignment with the circuit board, at the correct separation distance, while the solder cools and solidifies. The BGA is a solution to the problem of producing a miniature package for an IC with many hundreds of I/O. As pin grid arrays and dual-in-line (DIP) surface mount (SOIC) packages are produced with more and more pins, and with decreasing spacing between the pins, difficulties arose in the soldering process. As package pins got closer together, the danger of accidentally bridging adjacent pins with solder grew. BGAs do not have this problem, because the solder is factory-applied to the package in exactly the right amount. Alternatively, solder balls can be replaced by solder landing pads, forming a Land Grid Array (LGA) package.

Figure 2:
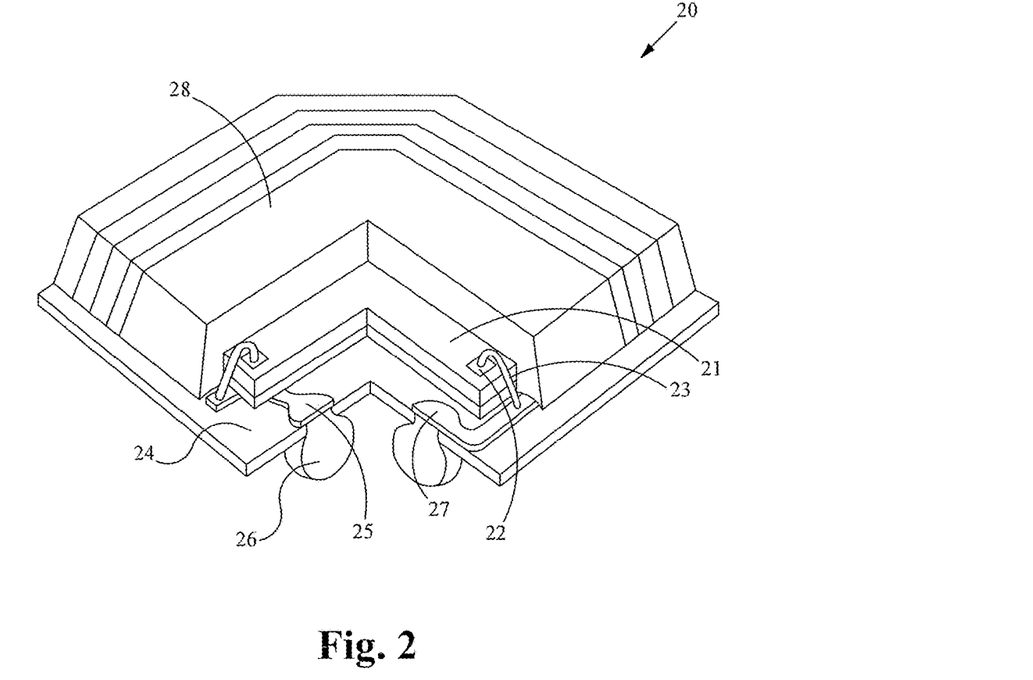
FIG. 2 is a prior art Ball Grid Array package in cross section.

FIG. 2 shows a cutaway image of a generic BGA package 20. Generally, an IC 21 has bondpads 22 to which bondwires 23 are affixed. The IC 21 is mounted on a substrate 24. In current practice, the substrate 24 is a laminate, such as polyimide. Generally, the substrate 24 is of a similar construction to a PCB. The substrate 24 has copper patterns 25 formed thereon. The bondwires 23 effectuate electrical contact between the IC 21 and the copper patterns 25. The copper patterns 25 are electrically connected to solder balls 26 through via holes 27 in the substrate 24. In most embodiments of BGA packages, the IC 21 is encapsulated by a mold compound 28. Although BGA packages effectuate large I/O count devices in small areas, they are susceptible to moisture. Generally, moisture seeps into packages while awaiting assembly into a finished product, such as a computer. When the package is heated to solder the device into its end application, moisture trapped within the device turns into vapor and cannot escape quickly enough, causing the package to burst open. This phenomenon is known as the "popcorn" effect. What is needed is a semiconductor package that is robust to both structural stressors and moisture.

SUMMARY OF THE DISCLOSURE

In one aspect of the invention, a process for forming an exposed die attach pad (EDAP) semiconductor package comprises at least partially encasing a first leadframe strip having at least one exposed die attach pad (DAP) in a first mold compound thereby forming a molded leadframe strip, mounting at least one semiconductor device on the molded leadframe strip, mounting bondwires on the at least one semiconductor device to effectuate electrical contact between the at least one semiconductor device and the at least one molded leadframe, at least partially encasing the molded leadframe strip, the at least one semiconductor device, and bondwires, and singulating the molded leadframe strip to form discrete EDAP packages. In some embodiments, the process further comprises coupling the first leadframe strip to a second leadframe strip by a soft metal. The soft metal comprises at least one of the following materials: gold, silver, lead, and tin. The first and second mold compounds are able to be identical or different compounds.

In another aspect of the invention, an apparatus for forming an EDAP package comprises means for at least partially encasing a first leadframe strip having a plurality of die attach pads in a first mold compound thereby forming a molded leadframe strip, means for mounting at least one semiconductor device on the at least one molded leadframe strip, means for mounting bondwires on the at least one semiconductor device to effectuate electrical contact between the at least one semiconductor device and the molded leadframe, means for at least partially encasing the molded leadframe strip, the at least one semiconductor device, and bondwires in a second mold compound and means for singulating the molded leadframe strip to form discrete and grid array packages. In some embodiments, the apparatus further comprises an embossing surface for forming a step cavity into the molded leadframe strip for encapsulating the at least one semiconductor device. Optionally, the apparatus further comprises means for mounting a cap on the molded leadframe strip thereby fainting a full cavity for encapsulating the at least one semiconductor device. The cap comprises at least one of the following materials: glass, silicon, ceramic, metal, epoxy, and plastic. In some embodiments, the apparatus further comprises means for coupling the first leadframe to a second leadframe by a soft metal. The soft metal comprises at least one of the following materials: gold, silver, lead, and tin. The first and second mold compounds are able to be identical or different compounds.

As another aspect of the invention, an exposed die attach pad package comprising a first leadframe, the leadframe having a die attach pad, a substrate for supporting the leadframe, at least one semiconductor die mounted on the leadframe, a plurality of bondwires to effectuate electrical contact between the leadframe and the at least one semiconductor die, and a second mold compound for at least partially encasing the first leadframe, at least one semiconductor die, and plurality of bondwires is disclosed. In some embodiments, the substrate comprises a first mold compound. Optionally, the semiconductor further comprises a step cavity or a cap for forming a full cavity. The cap is able to be comprised of glass, silicon, ceramic, or metal. In some embodiments, the semiconductor device further comprises a second mold compound for at least partially encasing the first leadframe, the substrate, the at least one semiconductor device and the plurality of wirebonds. Optionally, the semiconductor package further comprises a second leadframe coupled to the first leadframe by a soft metal. The soft metal is able to be comprised of at least one of the following materials: gold, silver, lead and tin.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

Figure 3:
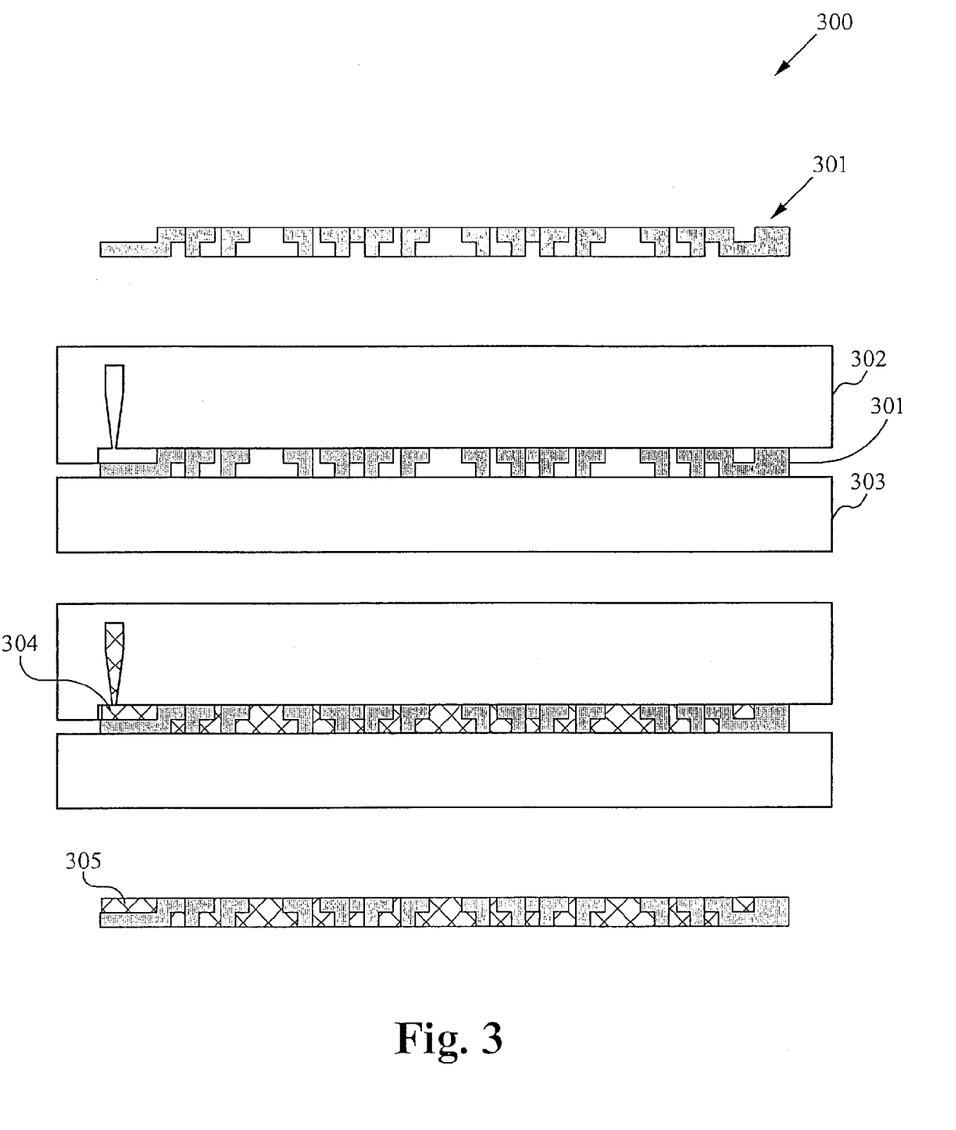
FIG. 3 is a process for forming a molded leadframe per an embodiment of the current invention.

In a first aspect of the invention, a process 300 for forming semiconductor packages is detailed in FIG. 3. A leadframe 301 is shown in cross section. In some embodiments, a top mold 302 and a bottom mold 303 are placed to effectuate the injection therein of a mold compound 304. The top and bottom molds 302, 303 can be metal, ceramic, or any material having an appropriate thermal characteristic to withstand the temperatures of the mold compound 304 in its liquid state. It is commonly known by those of ordinary skill in the art of semiconductor device manufacturing that a wide variety of mold compounds 304 is able to be used, each having advantages, disadvantages, and characteristics appropriate for a given application. By way of example, in high temperature applications such as microprocessors which generate a significant amount of heat, a high thermal conductivity mold compound 304 is able to be used. What is formed is a molded lead frame 305. Advantageously, the molded leadframe 305 will display enhanced rigidity and robust reliability characteristics. The use of a mold compound 304 further enhances encapsulation and protection from external moisture that standard PCB substrates such as polyimide or FR4 cannot provide.

Figure 4A:
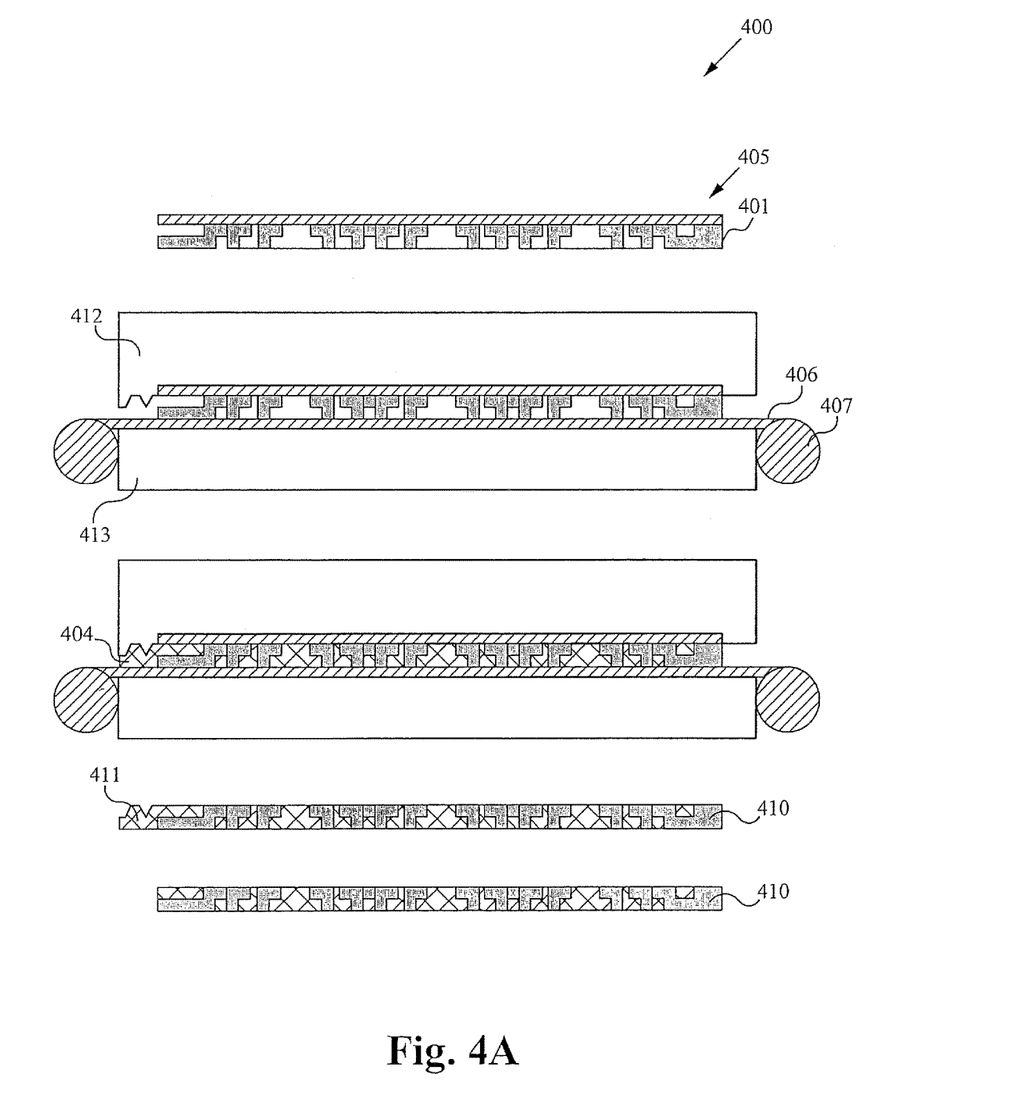
FIG. 4A is a process for forming a molded leadframe per an embodiment of the current invention.

For more predictable molding results, carrier tape is able to be used effectuate the molding process. FIG. 4A details another embodiment of the invention. A process 400 includes applying tape 405 on its adhesive side to a leadframe 401. The leadframe 401 is then placed in a top mold cavity 412 by the top side of the leadframe 401. On the opposite side of the leadframe 401, non-adhesive tape 406 is prepared in a tape loader 407 at the bottom mold 413. Once the leadfame 401 is in place between the top mold 412 and the bottom mold 413, mold compound 404 is injected and fills all empty cavities. When removed from the mold, a molded leadframe 410 is formed. Optionally, a de-gate/de-runner step removes excess mold compound 411.

Figure 4B:
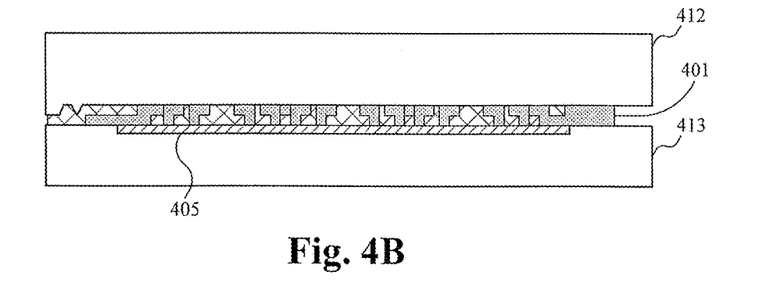
FIG. 4B is a process for forming a molded leadframe per an embodiment of the current invention.
Figure 4C:
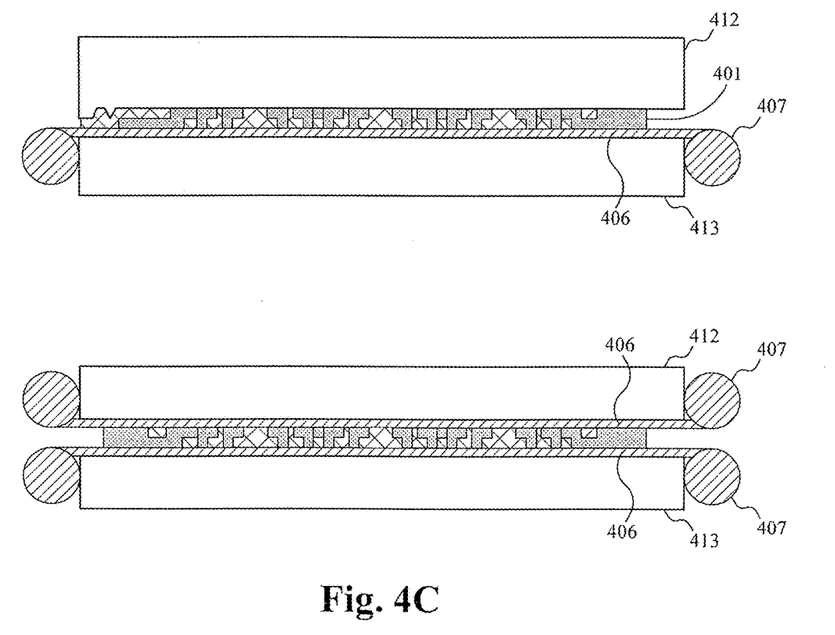
FIG. 4C illustrates two exemplary processes for forming a molded leadframe of the current invention.

FIG. 4B shows alternate embodiments for the process detailed in FIG. 4A. In some embodiments, the leadframe 401 is able to be placed between the top mold 412 and bottom mold 413 with adhesive tape 405 applied to the bottom. FIG. 4C shows embodiments wherein the leadframe 401 is able to be placed between the top mold 412 and bottom mold 413 without the use of adhesive tape. In an embodiment, non adhesive tape 406 is able to be provided by a tape loader 407 on the bottom surface of the leadframe 401. In another exemplary embodiment, two tape loaders 407 are provided to effectuate the molding of the leadframe 401. It will be appreciated by those of ordinary skill in the art of semiconductor manufacturing that several embodiments exist to place a leadframe 401 between a top mold 412 and a bottom mold 413 and the embodiments discussed herein are written solely to be exemplary and non limiting.

Figure 5:
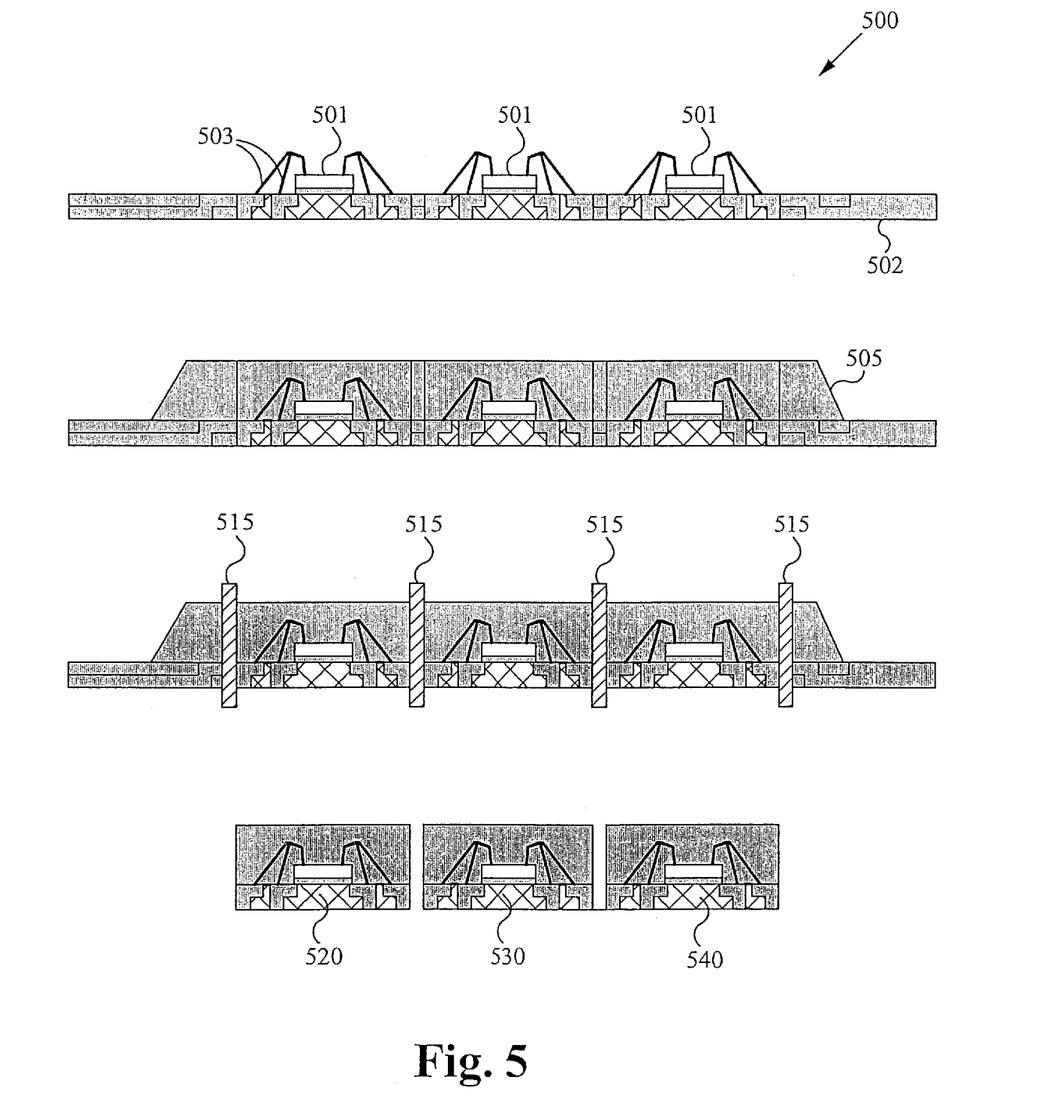
FIG. 5 is a process for forming individual packages per an embodiment of the current invention.

FIG. 5 shows a process 500 for the completion of the semiconductor packaging process. Semiconductor devices 501 are mounted on the molded leadframe strip 502. In some embodiments, multiple semiconductor devices 501 are mounted in each individual position on the molded leadframe strip 502. Such devices are known as multi chip modules (MCM). Bondwires 503 are mounted on the semiconductor devices 501 to effectuate electrical contact between the molded leadframe strip 502 and the semiconductor devices 501. In some embodiments where multiple semiconductor devices 501 are placed in each position, bondwires 503 can be placed to effectuate electrical contact between them as applications require. Next, a second mold compound 505 is applied to the molded leadframe strip 502. The second mold 505 encases the semiconductor devices 501 and bondwires 503 to protect them from harsh outer environments. In some embodiments, the second mold compound 505 and the first mold compound described in FIGS. 3 and 4 are the same. However, in other embodiments, the first and second mold compound 505 are able to be different to meet the demands of particular applications. By way of example, the semiconductor device 501 and the leadframe 401 in FIG. 4 can have different coefficients of expansion in response to heat, and different mold compounds having different thermal characteristics such as thermal resistivity and thermal expansion can be used to offset the effects of the leadframe 401 expanding. The molded leadframe strip 502 are then singulated by saw blades 515 to form singulated semiconductor packages 520, 530 and 540. The singulated devices 520 530 and 540 are generally tested, subjected to stress, and tested again to ensure reliability and to filter out non passing or non standard units.

Figure 6A:
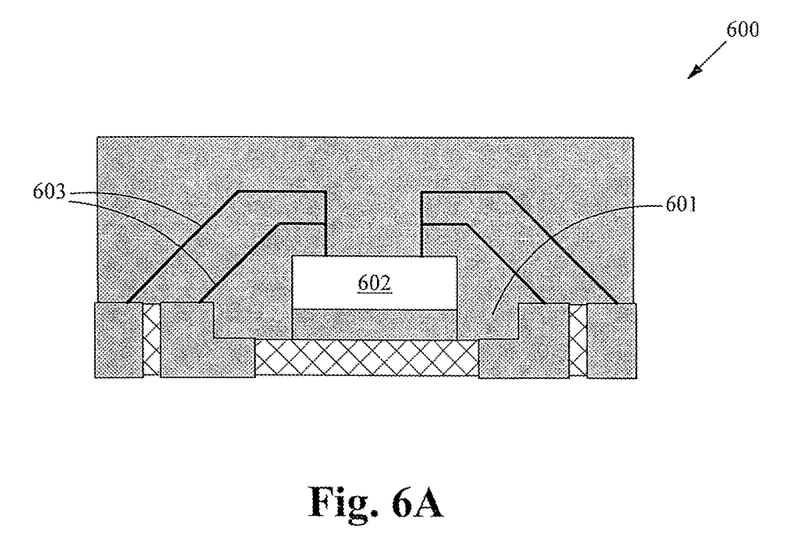
FIG. 6A is a semiconductor package per an embodiment of the current invention.
Figure 6B:
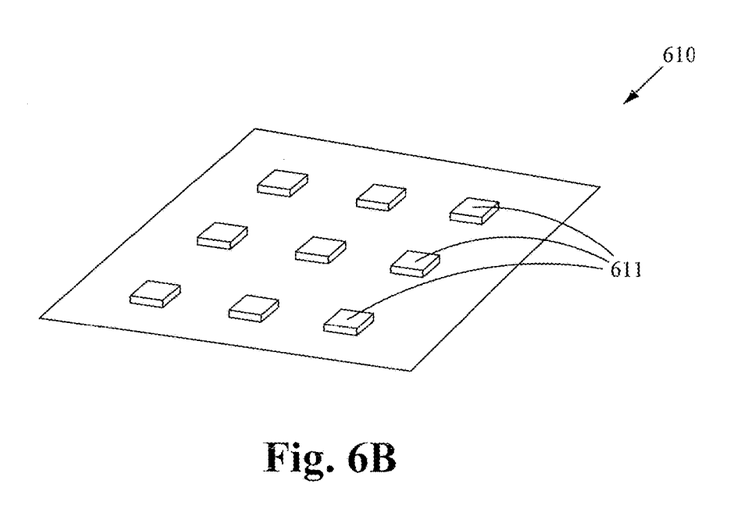
FIG. 6B is apparatus for realizing the package depicted in FIG. 6A.
Figure 6C:
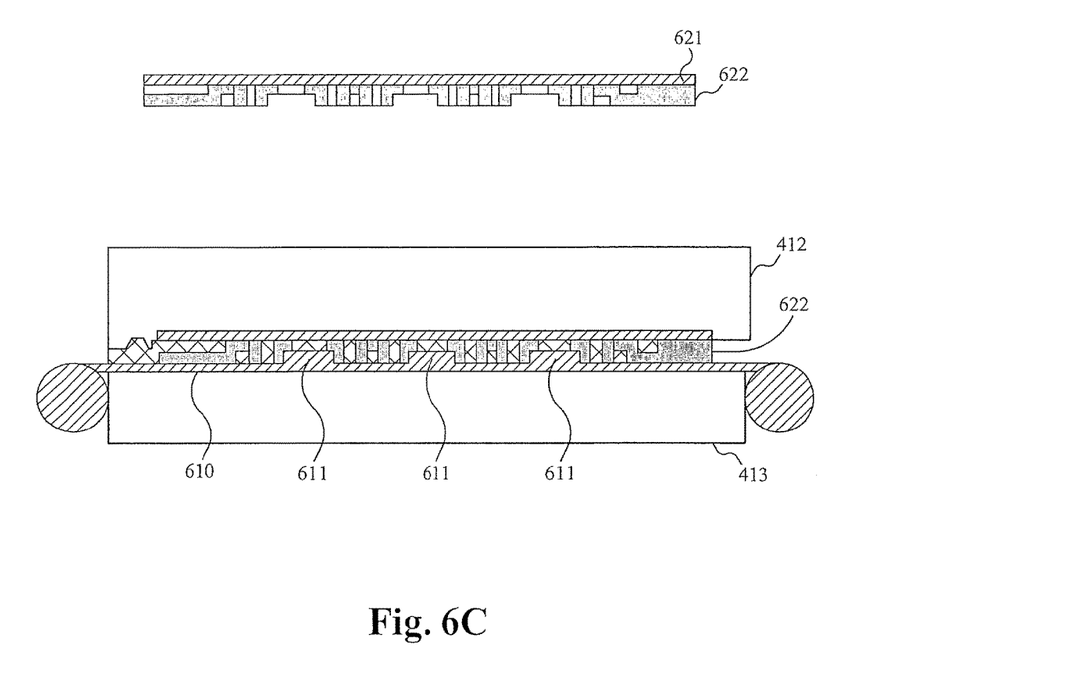
FIG. 6C is an alternate process for forming a package in FIG. 6A.

In some applications, it is advantageous for greater height clearance within the semiconductor package. FIG. 6A shows a singulated semiconductor package 600 in cross section. Within the package, a recessed area 601 is capable of receiving a thicker semiconductor die 602, larger bondwires 603 or in certain embodiments multiple stacked die. FIG. 6B shows an exemplary surface 610 of the mold 412 or 413 shown in FIG. 4B. Elevated protrusions 611 are placed to coincide with a leadframe strip to emboss a recessed area 601 into the leadframe. In an exemplary embodiment, as illustrated in FIG. 6C, adhesive tape 621 is applied to the back surface of the leadframe strip 622. The leadframe is flipped over such that its top surface is embossed by the non adhesive tape 610 having the protrusions 611.

Figure 6D:
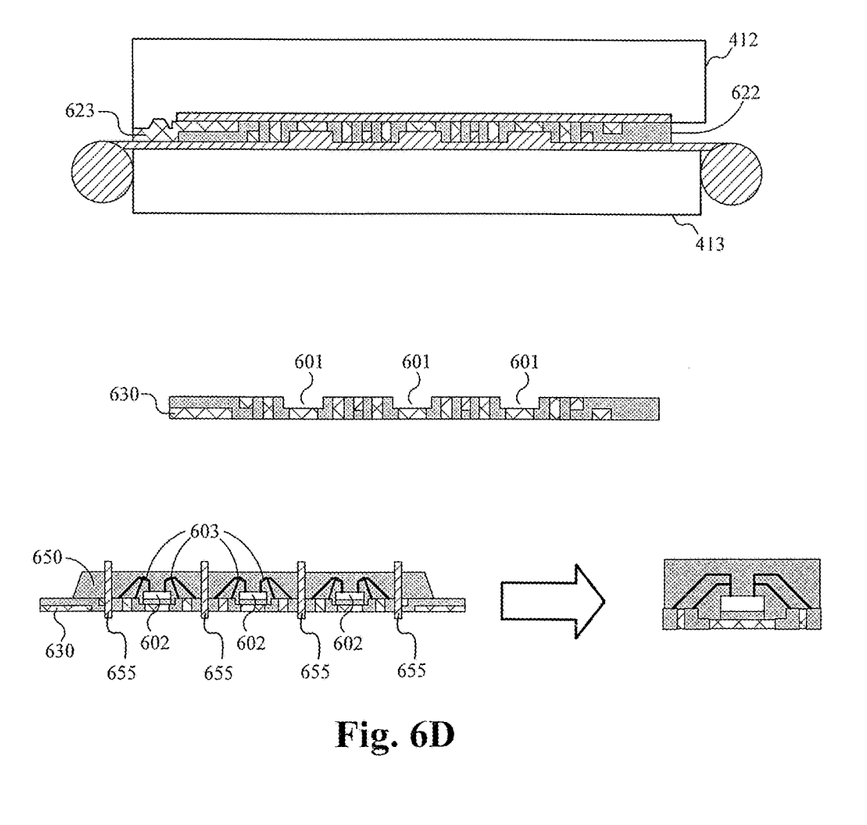
FIG. 6D is the remainder of the process for forming the package FIG. 6A.

FIG. 6D shows the leadframe strip 622 with a first mold compound 623 to form a molded leadframe 630 having recessed areas 601. To form singulated packages, semiconductor devices 602 and bondwires 603 are affixed onto the molded leadframe 630. The devices 602, bondwires 603 and molded leadframe 630 are encased in a second mold compound 650. The second mold compound 650 and the first mold compound 623 are able to be the same compound or different compounds depending on the application. Saw blades 655 then singulate the molded leadframe strip 630 into individual semiconductor packages 600.

Figure 6E:
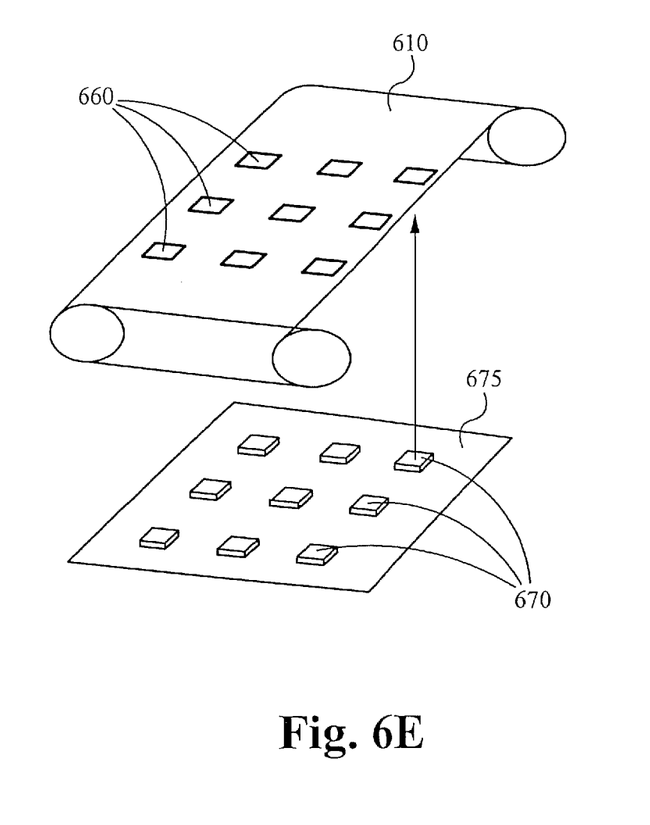
FIG. 6E is an alternate apparatus for realizing the package depicted in FIG. 6A.

An alternative surface is shown in FIG. 6E. In certain applications, such as high temperature applications, thick leadframes are advantageous. To accommodate thick leadframes, the non adhesive tape 610 is able to have pre-formed holes 660 configured to receive protrusions 670 on a mold surface 675. The mold surface 675 can be the surface of the top mold 412 or the bottom bold 413. The mold is able to be formed of metal, ceramic, hard impact rubber, or any other suitable material.

Figure 7:
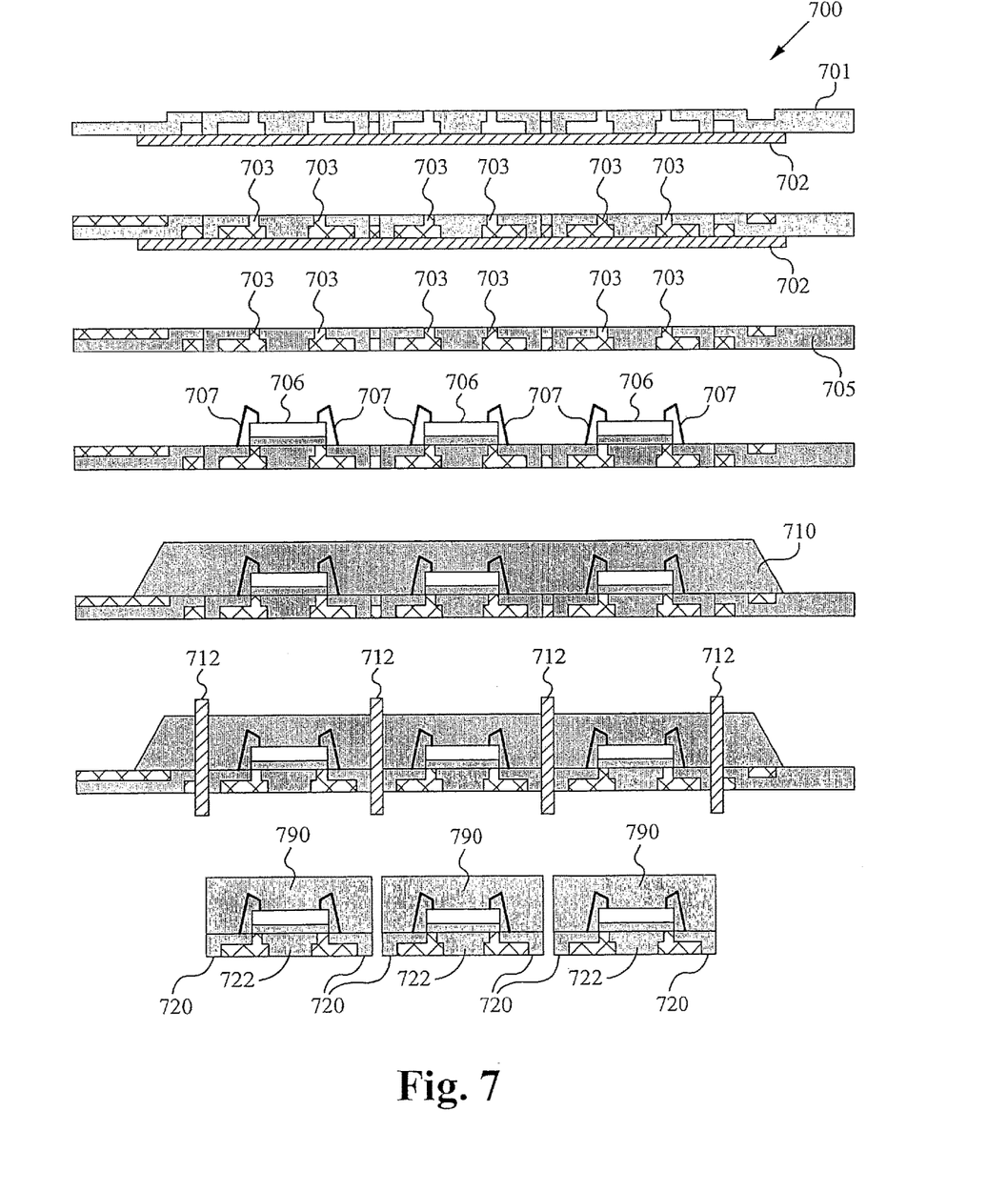
FIG. 7 is a process for forming an exposed die attach pad package.

In a particular aspect of the invention, an exposed die attach pad (EDAP) package and a process for producing the same is disclosed. FIG. 7 details a process 700 for forming singulated EDAP package devices 790. A leadframe stip 701 is attached to adhesive tape 702. Preferably, the leadframe strip 701 comprises a die attach pad (DAP) 722. In application, the DAP is generally soldered to a PCB, thereby effectuating efficient transfer and sinking of heat from the DAP 722. It is commonly known in the art of board level assembly that a material having a low thermal resistivity, such as copper, is formed on to a PCB to make thermal contact with the exposed DAP when mounted. Also, exposed DAPs are commonly used for a robust electrical ground. In high current applications, it is advantageous to have a robust electrical ground for optimum performance. In some embodiments, the leadframe strip 701 is a half etched leadframe. Half etched leadframes are commonly used and understood in the art of semiconductor manufacturing and methods to achieve them need not be recounted. The leadframe strip 701 is molded by a first mold compound 703 by any of the processes detailed in FIGS. 4 and 5. The tape 702 is removed forming a molded leadframe strip 705. Next, semiconductor devices 706 are affixed onto the molded leadframe strip onto each individual position. In some embodiments, multiple devices 706 can be placed in each position as applications require. In application, heat generated by the bondwires is efficiently sunk to a PCB via the DAP, since the DAP is preferably made of metal or another material having a low thermal resistivity. Bondwires 707 are affixed to effectuate electrical contact between the molded leadframe strip 705 and the devices 706. The molded leadframe strip 705, devices 706 and bondwires 707 are encased in a second mold compound 710. The second 710 and the first 703 are able to be identical mold compounds or different mold compounds as applications require. The double molded leadframe strip 705 is singulated by saw blades 712 forming individual EDAP package devices 790. These individual devices are then able to be tested, marked and bulk packaged for shipping and assembly. It will be apparent to those of ordinary skill in the art of semiconductor device assembly that although few leads 720 are shown, many dozens to hundreds of leads are able to be realized using the process described herein. Furthermore, flexibility in routing I/O is advantageous, since end users can have specific demands as to the locations of I/O on a package landing pattern. To that end, a second leadframe (not shown) is able to be used. A second leadframe is able to couple to the first leadframe by use of a soft metal. The second leadframe is able to be used to route the I/O to any pattern required by an application, allowing great flexibility in footprints and landing patterns.

Figure 8:
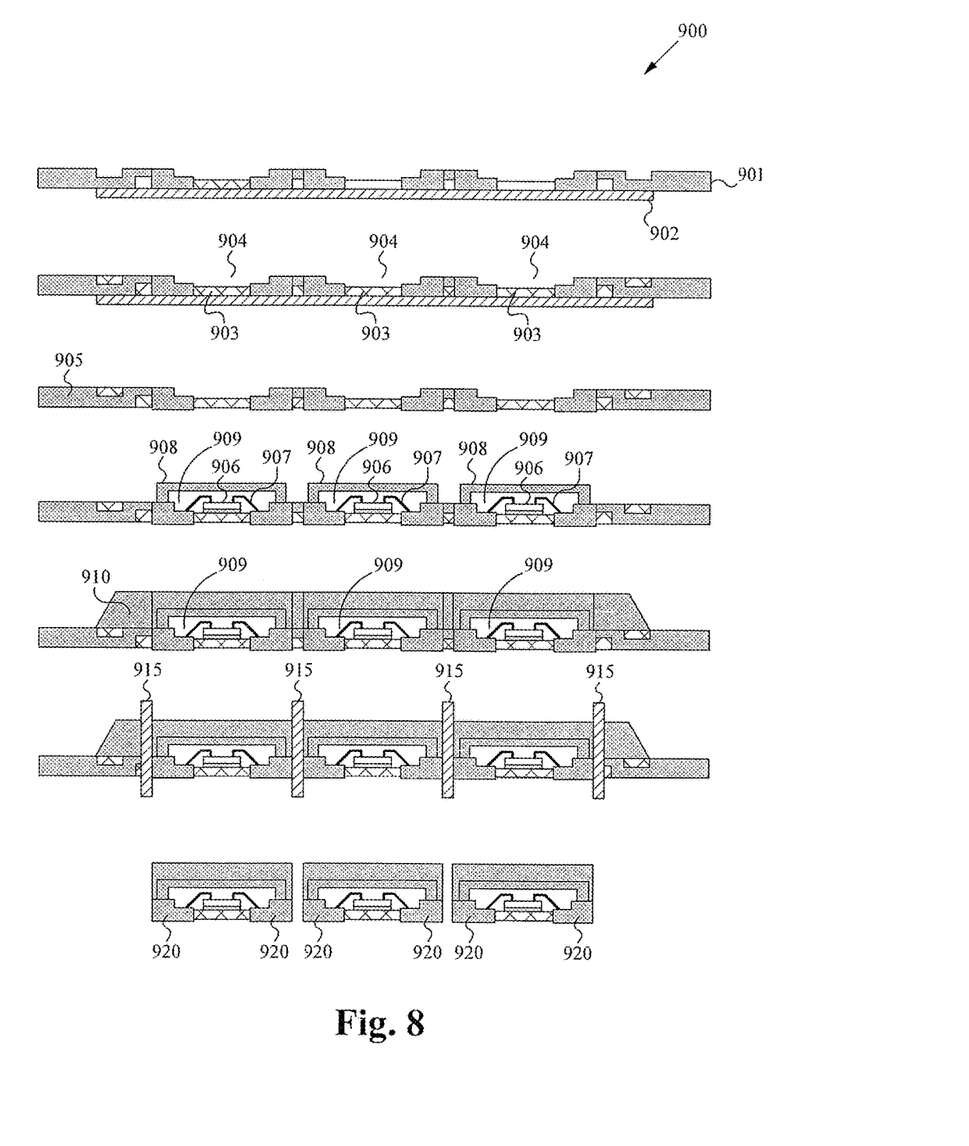
FIG. 8 shows a leadframe having caps per one embodiment of this invention.

FIG. 8 shows a leadframe strip 901 is mounted to adhesive tape 902. In some embodiments, the leadframe 901 is a half etched leadframe. The leadframe strip 901 is molded with a first mold compound 903. By way of example, the first mold compound is able to be a thermoset compound or a thermoplastic compound. The adhesive tape 902 is removed forming a molded step cavity leadframe strip 905. At least one semiconductor device 906 is mounted within each cavity 904. Wirebonds 907 effectuate electrical contact between the semiconductor device and molded step cavity leadframe strip 905. In some embodiments where multiple semiconductor devices 906 are mounted in each step cavity 904, wirebonds 907 are able to effectuate electrical contact between the multiple devices 906 as applications require. A cap 908 is affixed to the molded cavity leadframe strip forming a full cavity 909. The cap 908 is able to be comprised of silicon, glass, metal, ceramic, or any other convenient material or combination of materials as particular applications require. A second mold compound 910 is formed over the molded step cavity leadframe strip 905, semiconductor devices 906 and wirebonds 907. The second mold compound 910 is able to be identical to or different from the first mold compound 903 as applications require. Saw blades 915 singulate the molded step cavity leadframe strip 905 into individual cavity LGA packaged devices 920.

Figure 9:
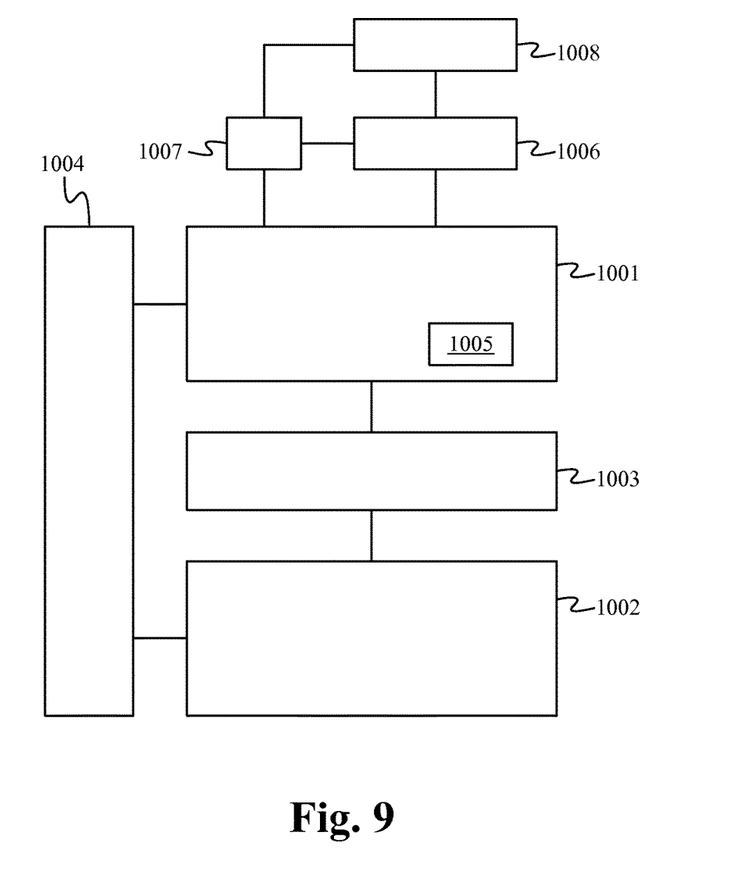
FIG. 9 shows a block diagram of a dual leadframe embodiment of this invention.

FIG. 9 shows a block diagram of a double layered leadframe. A first leadframe 1001 having one or more die attach pads 1005 is coupled to a second leadframe 1002. In some embodiments, the first leadframe 1001 and second leadframe 1002 are able to be coupled together during a first molding process as described above. As shown in FIG. 9, any of the first leadframe 1001 and second leadframe 1002 may be exposed to a first mold 1004 such that the first leadframe 1001 and second leadframe 1002 are at least partially encased in the first mold 1004 to enhance rigidity and reliability. In some embodiments, a soft metal 1003 such as gold or silver may be applied to one of or both of the top and bottom surfaces of the first leadframe 1001 and second leadframe 1002 to increase the performance of desired electrical contact between them. By way of example, one or more semiconductor die 1006 and bondwires 1007 may be placed thereon, and a second mold compound 1008 may be applied before singulation at least partially encasing the semiconductor die 1006 and the bondwires 1007, wherein the bondwires 1007 are mounted to the semiconductor die 1006 to effectuate electrical contact between the semiconductor die 1006 and the first leadframe 1001.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A process for forming a semiconductor package comprising:
   a. at least partially encasing a first leadframe strip having at least one die attach pad (DAP) in a first mold compound, thereby forming a molded leadframe strip, wherein the at least partially encasing comprises:
      placing the first leadframe strip in a mold cavity, wherein the mold cavity is defined by a top mold and a bottom mold; and
      injecting the first mold compound into the mold cavity;
   b. mounting at least one semiconductor device on the molded leadframe strip such that, at a cross-section of the at least one semiconductor package, a central portion of a lower surface of the at least one semiconductor device is in contact with the DAP, and first and second portions of the lower surface of the at least one semiconductor device extending laterally from the central portion to side edges of the at least one semiconductor device are in contact solely with the first mold compound;
   c. mounting bondwires on the at least one semiconductor device to effectuate electrical contact between the at least one semiconductor device and the at least one molded leadframe;
   d. at least partially encasing the at least one semiconductor device and bondwires in a second mold compound such that the top of the at least one semiconductor device contacts the second mold compound; and
   e. singulating the molded leadframe strip to form discrete packages.

2. The process of claim 1 further comprising coupling the first leadframe strip to a second leadframe strip by a soft metal.

3. The process of claim 2 wherein the soft metal comprises at least one of the following materials: gold, silver, lead, and tin.

4. The process of claim 1 wherein the first and second mold compounds are different compounds.

5. The process of claim 1 wherein the first and second mold compounds have different thermal resistivity.

* * * * *